United States Patent

[11] 3,617,279

[72] Inventors Urbain Leopold Laridon
Wilrijk;
Gerard Albert Delzenne, 'S-Gravenwezel, both of Belgium
[21] Appl. No. 775,494
[22] Filed Nov. 13, 1968
[45] Patented Nov. 2, 1971
[73] Assignee Gevaert-AGFA N.V.
Mortsel, Belgium
[32] Priority Dec. 4, 1967
[33] Great Britain
[31] 55085/67

[54] PHOTOPOLYMERIZATION OF ETHYLENICALLY UNSATURATED ORGANIC COMPOUNDS EMPLOYING AN OXIDO-OXAZOLE, PHOTOPOLYMERIZABLE COATED ELEMENT AND METHOD OF USING
7 Claims, No Drawings

[52] U.S. Cl. .......... 96/35.1, 96/115, 204/159.23
[51] Int. Cl. .......... G03c 5/00, G03c 1/68
[50] Field of Search .......... 96/115 P, 35.1; 204/159.23

[56] References Cited
UNITED STATES PATENTS

| | | | |
|---|---|---|---|
| 2,773,822 | 12/1956 | Kern | 96/115 P |
| 3,099,558 | 7/1963 | Levinos | 96/115 P |
| 3,244,519 | 4/1966 | Schwerin | 96/115 P |
| 3,429,795 | 2/1969 | Delzenne et al. | 96/115 P |

*Primary Examiner*—Murray Katz
*Attorney*—Alfred W. Breiner

ABSTRACT: A photopolymerization process comprising irradiating with light of wave lengths ranging from 2,500 to 4,000 Angstroms, a composition comprising a photopolymerizable ethylenically unsaturated organic compound, and an oxido-oxazole photopolymerization initiator having a structural formula

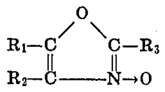

and

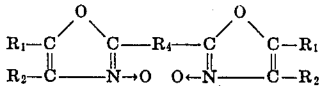

wherein each of $R_1$, $R_2$ and $R_3$ is selected from the group consisting of alkyl groups of one to three carbon atoms, and an aryl group, and $R_4$ is selected from an alkyl group of two to three carbon atoms, and an aryl group, these oxido-oxazoles being present in the form of the free bases or in the form of their hydrochlorides; and photopolymerizable elements comprising a support, an ethylenically unsaturated organic compound, and an oxido-oxazole as set forth, are described. The oxido-oxazole initiators provide fast and effective polymerization.

PHOTOPOLYMERIZATION OF ETHYLENICALLY UNSATURATED ORGANIC COMPOUNDS EMPLOYING AN OXIDO-OXAZOLE, PHOTOPOLYMERIZABLE COATED ELEMENT AND METHOD OF USING

The present invention relates to the photopolymerisation of ethylenically unsaturated organic compounds and to polymers obtained therefrom.

The photopolymerization of ethylenically unsaturated organic compounds can be initiated by exposure to high intensity radiation such a s ultraviolet rays. Methyl acrylate, for instance, on long standing in sunlight is transformed into a transparent mass (cf. Ellis The Chemistry of Synthetic Resins, Vol. II ( 1935 ) page 1072 ). Polymerization, however, by the use of light alone, proceeds at a much slower rate when compared to polymerization brought about by a free radical-generating catalyst or by heat. Moreover, the use of light alone, unaided by other agents, requires very long exposure times in order to polymerize the monomer sufficiently. Furthermore, the low rate of polymerization necessitates the use of extremely intense radiations such as those obtained from high intensity carbon arcs.

A lot of photopolymerization initiators, which under the influence of actinic light increase the photopolymerization rate, have already been described. A survey of such photopolymerization initiators has been given by G. Delzenne in Industrie Chimique Belge, 24, (1959) 739–764.

According to the present invention a process is provided for the photopolymerization of ethylenically unsaturated organic compounds, which process comprises irradiating with light of wavelengths ranging from 2500 to 4000 Angstroms a composition comprising a photopolymerizable ethylenically unsaturated organic compound and as a photopolymerization initiator an oxide-oxazole corresponding to one of the general formulas:

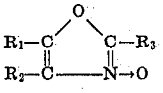

and

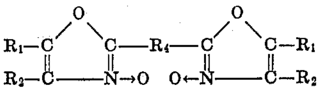

wherein:

each of $R_1$ , $R_2$ and $R_3$ (same or different) represents an alkyl group of one to three carbon atoms, or an aryl group including a substituted aryl group, and $R_4$ represent an alkyl group of two to three carbon atoms or an aryl group.

These oxido-oxazoles may be present in the photopolymerization reaction in the form of the free base or in the form of their hydrochlorides.

The latter are formed on passing hydrogen chloride through an acetic acid solution of a monoxime of an α-diketone and the corresponding aldehyde. The free oxido-oxazoles are produced from their hydrochlorideson treating them with a base.

The above formulas of oxido-oxazoles are written according to the structure formulas proposed by Cornforth and Cornforth in J.Chem.Soc. (1947) 96.

Suitable oxido-oxazoles, which can be used as photopolymerization initiators according to the invention are 2 -phenyl- 4,5 -dimethyl-N-oxido-oxazole
2 -o-hydroxphenyl- 4,5 -dimethyl-N-oxido-oxazole
2 -p-hydroxphenyl- 4,5 -dimethyl-N-oxido-oxazole
2 -p-methoxyphenyl- 4,5 dimethyl-N-oxido-oxazole
2 -p-dimethylaminophenyl- 4,5 -dimethyl-N-oxido-oxazole
2,4 -diphenyl-5 -methyl-N-oxido-oxazole
2 -p-dimethylaminophenyl- 4 -phenyl- 5 -methyl-N-oxido-oxazole
2 -m-chlorophenyl- 4 -phenyl- 5 -methyl-N-oxido-oxazole
2,4,5 -triphenyl-N-oxido-oxazole
2 -p-hydroxyphenyl 4,5 -diphenyl-N-oxido-oxazole
2 -o-hydroxphenyl- 4,5 -diphenyl-N-oxido-oxazole
2 -p-methoxphenyl- 4,5 -diphenyl-N-oxido-oxazole 2 -p-dimethylaminophenyl- 4,5 -diphenyl-N-oxido-oxazole
4,4 -bis[2-(4,5-dimethyl-N-oxido-oxazole)]-phenylene
4,4 -bis [2-( 4,5 -diphenyl-N-oxido-oxazole)]-phenylene The quantity of oxido-oxazole to be used as photopolymerization initiator of course depends upon many variables including the particular oxido-oxazole used, the wavelength of light employed, the irradiation time, and the monomer or monomers present. Usually the amount of oxido-oxazole is within the range of 0.01 to 5 percent by weight based on the monomeric material initially present. It is seldom necessary to employ more than 0.2 to 2 percent by weight in order to obtain a good polymerisation rate.

The ethylenically unsaturated organic compounds may be exposed to any source of radiation providing wavelengths in the range of 2500–4000 Angstroms, preferably in the wavelength region of 3000–4000 Angstroms. With certain oxido-oxazoles having a higher absorption maximum even radiations of wavelengths above 5000 Angstroms may be used. Suitable light sources include carbon arcs, mercury vapor lamps, fluorescent lamps, argon glow lamps, photographic flood lamps and tungsten lamps. Moreover, ordinary daylight may be used too.

The photopolymerization can be carried out according to any of the well-known processes, such as bulk, emulsion, suspension and solution polymerization processes. In all of these processes, the addition of an oxido-oxazole according to the invention to photopolymerizable materials subjected to the action of actinic light greatly increases the rate of photopolymerization.

A base or support may be coated with a solution of the ethylenically unsaturated organic compound in a solvent therefor, this solution containing in dissolved state or homogeneously dispersed therein a photopolymerization-initiating oxido-oxazole, whereupon the solvent or solvent mixture is eliminated by known means such as evaporation. Thereby a more or less thin coating of the photopolymerizable composition is left on the base or support. Thereafter the dried photopolymerizable coating is exposed to actinic light rays.

When the photopolymerizable composition is exposed to actinic light rays the polymerization does not start immediately. Only after a short period, which among others depends on the ethylenically unsaturated organic composition, the photopolymerization initiator, and the light intensity used, the photopolymerization starts. The period necessary for obtaining a perceptible amount of polymerization is a measure of the efficiency of the photopolymerization initiator, and is named the inhibition period.

It has been observed too that in the presence of photochemically formed iron (II) ions a sensible acceleration of the photo-initiation by oxido-oxazoles occurs.

In some circumstances it may be desirable that the photopolymerizable composition comprises also a hydrophilic or hydrophobic colloid as carrier or binding agent for the ethylenically unsaturated organic compound and the oxido-oxazole initiating photopolymerization. By the presence of this binding agent the properties of the light-sensitive layer are of course highly influenced. The choice of the binding agent is dependent on its solubility in solvents, which can also be used as solvents for the ethylenically unsaturated organic compounds and for the oxdio-oxazole of the invention. Such binding agents are, e.g., polystyrene, polymethyl methacrylate, polyvinyl acetate, polyvinylbutyral, partially saponified cellulose acetate and other polymers that are soluble in solvents for initiators and monomers. In some circumstances water-soluble polymers can be used such as gelatin, casein, starch, carboxymethylcellulose, and polyvinyl alcohol. The rate of photopolymerizable composition to binding agent obviously also influences the photopolymerization. The larger this ratio, the higher the photopolymerization rate generally will be for one and the same ethylenically unsaturated organic compound.

If the photopolymerizable composition is water-soluble, water may be used as solvent for coating the support. On the contrary, if water-insoluble photopolymerizable compositions are used, organic solvents, mixtures of organic solvents or mixtures of organic solvents and water may be employed.

The process of the invention is applied to the photopolymerization of compositions comprising ethylenically unsaturated organic compounds. These compositions may comprise one or more ethylenically unsaturated polymerizable compounds such as styrene, acrylamide, methacrylamide, methyl methacrylate, diethylaminoethyl methacrylate, and acrylonitrile. When two of these monomers are used in the same photopolymerizable composition or if they are mixed with other polymerizable compounds, copolymers are formed during the photopolymerization. It is further presumed that in case the photopolymerization material is used together with a polymeric binding agent, graft copolymers are formed between the polymeric binder and the photopolymerized material.

The photopolymerizable composition may also comprise or consist of unsaturated compounds having more than one carbon-to-carbon double bond, e.g., two terminal vinyl groups, or of a polymeric compound having ethylenic unsaturation. During polymerization of these compositions usually cross-linking will occur by means of the plurally unsaturated compound. Examples of compounds containing more than one carbon-to-carbon double bond are, e.g., divinylbenzene, diglycol diacrylates, and N,N-alkylene-bis-acrylamides. Examples of polymeric compounds containing ethylenically unsaturation are e.g., allyl esters of polyacrylic acid, maleic esters of polyvinyl alcohol, polyhydrocarbons still containing carbon-to-carbon double bonds, unsaturated polyesters, cellulose acetomaleates, and allylcellulose.

In the photopolymerization of ethylenically unsaturated compounds with the oxido-oxazoles of the invention high temperatures are not required. The exposure, however, to strong light sources at a relatively short distance, brings about a certain heating of the mass to be polymerized, which heating exercises a favorable influence upon the polymerization rate.

The products of the invention are useful as adhesives, coating and impregnating agents, safety glass interlayers, etc. When photopolymerization of the compositions is carried out within a mold, optical articles such as lenses can be obtained.

The photopolymerizable compositions which contain oxido-oxazoles are useful in the preparation of photographic images.

The invention comprises spreading the photopolymerizable composition upon a surface such as a surface of metal and printing a design thereon photographically by exposure to light through a suitable image pattern. Hereby the light induces polymerization in the exposed areas of the photopolymerization composition, whereby the polymeric layer is rendered insoluble in the solvent or solvents, used for applying the photopolymerizable layer. Thereafter the nonexposed areas are washed away with a solvent for the monomeric material. In this way printing plates and photographic etching resists are manufactured, which can be further used as planographic printing plates, as matrices for printing matter, as screens for silk screen printing, and as photoresists for etching.

The image-wise photopolymerization can also induce differential softening properties to the layer. This makes possible a reproduction process by material transfer when the image-wise photopolymerized layer is subsequently warmed up and pressed against a receiving sheet, so that the softened areas are transferred to the receiving sheet.

The following examples illustrate the present invention.

EXAMPLE 1

A. PREPARATION OF OXIDO-OXAZOLE

In an Erlenmeyer flask were placed 360 ccs. of acetic acid, 54 g. of benzilmonoxime and 24 ccs. of distilled benzaldehyde. Through this mixture dry hydrogen chloride gas was bubbled for 1 hr. Already after 5 min. a solution was obtained and 5 min. later some product started to precipitate. Then the mixture was allowed to stay in the dark for 48 hrs.

The product precipitated was then filtered with suction, washed with ether, and dried under vacuum. Yield: 30 g. After recrystallisation from 440 ccs. of benzene, 21 g. of pure 2,4,5 -triphenyl-oxide-oxazole hydrochloride were obtained. Melting point: 172° C.

The free 2,4,5 -triphenyloxido-oxazole was obtained by dissolving 3 g. of the hydrochloride in 15 ccs. of methanol and on slightly alkalizing this solution by means of 25 percent aqueous ammonium hydroxide. The free base precipitated, was filtered with suction and finally dried under vacuum. Yield: 2.5 g.

The other oxido-oxazole hydrochlorides and their corresponding free bases were prepared analogously.

B. PHOTOPOLYMERIZATION

To a series of solutions of 1 g. of acrylamide in 10 ccs. of methanol oxido-oxazole hydrochlorides were added as listed in table I below. The solutions obtained were poured into test tubes of borosilicate glass and exposed by means of a mercury vapor lamp of 80 watt placed at a distance of 10 cm. The polymer formed precipitated. After 2 hrs. of exposure the respective yields were determined by filtration, drying and weighing of the polymer. The results are also to be found in table I below.

TABLE I

| Initiator: hydrochloride of— | Concentration (mole/litre) | Yield (percent) |
|---|---|---|
| 2,4,5-triphenyl-N-oxido-oxazole | 4. 10-4 | 27.7 |
| 2-p-methoxyphenyl-4,5-diphenyl-N-oxido-oxazole | 2. 10-4 | 42.2 |
| 2-o-hydroxyphenyl-4,5-diphenyl-N-oxido-oxazole | [1] 2. 10-4 | 59.4 |
| 2-o-hydroxyphenyl-4,5-dimethyl-N-oxido-oxazole | 2. 10-4 | 32.6 |
| 2,4-diphenyl-5-methyl-N-oxido-oxazole | 2. 10-4 | 38.1 |
| 2-m-chlorophenyl-4-phenyl-5-methyl-N-oxido-oxazole | 2. 10-4 | 35.2 |

[1] In this case a mixture of cyclohexanone and acetone was used as solvent.

EXAMPLE 2

A series of solutions was prepared of 6 g. of acrylamide in a mixture of 10 ccs. of ethylene glycol monomethyl ether and 10 ccs. of water. To these solutions were added oxido-oxazoles as listed below in a concentration of $10^{13}$ mole/litre. Each solution obtained was poured in a test tube and exposed by means of a mercury vapor lamp of 300 watt placed at 18 cm. The polymer formed remained dissolved and was then separated after exposure by adding an excess of methanol to the polymer solution. The results obtained are also listed in table II.

TABLE II

| Initiator | Time of exposure (min.) | Yield (percent) |
|---|---|---|
| 2,4,5-triphenyl-N-oxido-oxazole hydrochloride | 45 | 25 |
| | 60 | 90-95 |
| 2,4,5-triphenyl-N-oxido-oxazole | 45 | 47 |
| | 60 | 90-95 |
| 2-p-dimethylaminophenyl-4,5-diphenyl-N-oxido-oxazole hydrochloride | 15 | 21 |
| | 30 | 86 |
| | 45 | 90-95 |

EXAMPLE 3

10 ccs. of methyl methacrylate were dissolved in 10 ccs. of benzene, whereupon $10^{13}$ mole of 2,4,5 -triphenyl-N-oxido-oxazole hydrochloride was added per litre. Through this solution nitrogen was bubbled for 30 min. and the test tube was sealed. The solution was exposed for 5 hrs. by means of a 300 watt mercury vapor lamp placed at 18 cm. whereupon methanol was added. The quantity of polymer obtained amounted to 10.58 percent. In the same circumstances a test without oxido-oxazole yielded only 1.15 percent of polymer.

EXAMPLE 4

5 ccs. of triethylene glycol diacrylate were dissolved in a mixture of 7.5 ccs. of water and 7.5 ccs. of ethylene glycol monomethyl either. To this solution was added $10^{116\ 3}$ mole of 2,4,5 -triphenyl-N-oxido-oxazole hydrochloride per litre but no nitrogen was bubbled through the solution. Exposure was carried out as in example 3 . After 75 min. 13.32 percent of polymer were obtained.

EXAMPLE 5

A solution consisting of
5 ccs. of triethylene glycol diacrylate
10 g. of copolymer of ethylene and maleic anhydride
0.10 g. of 2,4,5 -triphenyl-N-oxido-oxazole hydrochloride
0.025 g. of 2,6 -di-tert-butyl-p-cresol as thermical inhibitor, and
50 ccs. of acetone
was applied to a glass plate . The layer formed was dried and had a thickness of about 0.3 mm.

This layer was then exposed for 15 min. to a line original by means of a mercury vapor lamp of 80 watt placed at a distance of 10 cm. Development was carried out with acetone whereby the nonexposed parts were washed away. A negative relief image was obtained.

EXAMPLE 6

A series of 10 percent solutions of acrylamide in a 50:50 mixture of water and ethylene glycol monomethyl ether was prepared. To each solution $10^{13}$ mole of oxido-oxazole as listed in table III below and $10^{13}$ mole of potassium iron (III) oxalate- 3 aq. were added per litre. Exposure was carried out by means of a mercury vapor lamp of 140 watt placed at 20 cm. The results obtained are also listed in table III.

TABLE III

| Initiator | Yield of polymer in percent per min. of exposure |
|---|---|
| 2,4,5-triphenyl-N-oxido-oxazole | 27 |
| 2,4,5-triphenyl-N-oxido-oxazole hydrochloride | 23.8 |
| 2-p-dimethylaminophenyl-4,5-diphenyl-N-oxido-oxazole hydrochloride | 10.95 |
| 2-p-dimethylaminophenyl-4,5-dimethyl-N-cxido-oxazole hydrochloride | 22.5 |

Without potassium iron (III) oxalate- 3 aq. and with 2,4,5 triphenyl-N-oxido-oxazole hydrochloride as photopolymerization initiator a yield of but 1,7 percent of polymer was obtained per min. of exposure.

We claim:

1. A process for the photopolymerization of ethylenically unsaturated organic compounds, which comprises irradiating with light of wavelengths ranging from 2500 to 4000 Angstroms a composition comprising a photopolymerizable ethylenically unsaturated organic compound and as a photopolymerization initiator an oxido-oxazole corresponding to one of the general formulas:

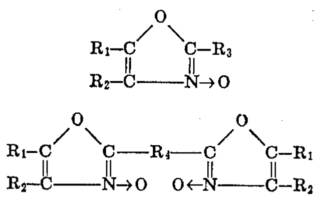

wherein each of $R_1$ , $R_2$ and $R_3$ is selected from the group consisting of alkyl groups of one to three carbon atoms, and an aryl group, and $R_4$ is selected from an alkyl group of two to three carbon atoms, and an aryl group, these oxido-oxazoles being present in the form of the free bases or in the form of their hydrochlorides.

2. A process according to claim 1, wherein the oxido-oxazole is 2,4,5 -triphenyl-N-oxido-oxazole hydrochloride.

3. A process according to claim 1, wherein the oxido-oxazole is 2 -p-methoxyphenyl- 4,5 -diphenyl-N-oxido-oxazole hydrochloride.

4. A process according to claim 1, wherein the oxido-oxazole is 2 -o-hydroxyphenyl- 4,5 -diphenyl-N-oxido-oxazole hydrochloride.

5. A process according to claim 1, wherein the oxido-oxazole is 2 -p-dimethylaminophenyl- 4,5 -diphenyl-N-oxido-oxazole hydrochloride.

6. A process for producing a polymeric photographic relief image, which comprise irradiating to light of wavelengths ranging from 2500 to 4000 Angstroms through a master pattern a photographic element comprising a support having thereon a light-sensitive layer comprising a photopolymerizable ethylenically unsaturated organic compound and as a photopolymerization initiator at least one oxido-oxazole corresponding to one of the general formulas:

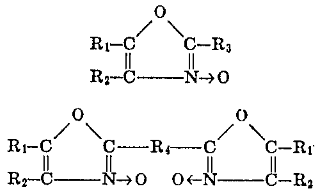

wherein each of $R_1$ , $R_2$ and $R_3$ is selected from the group consisting of alkyl groups of 1 to 3 carbon atoms, and an aryl group, and $R_4$ is selected from an alkyl group of two to three carbon atoms, and an aryl group, these oxido-oxazoles being present in the form of the free bases or in the form of their hydrochlorides, whereby in the exposed areas said ethylenically unsaturated organic compound is polymerized to an insoluble state, and removing the layer in the nonexposed areas by washing with a solvent for said ethylenically unsaturated organic compound.

7. A photopolymerizable element comprising a support and superposed thereon a light-sensitive layer comprising a photopolymerizable ethyleneically unsaturated organic compound and as photopolymerization initiator at least one oxido-oxazole corresponding to one of the formulas:

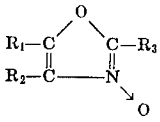

and

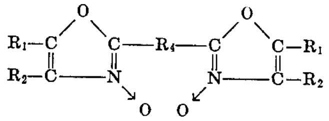

wherein each of $R_1$ , $R_2$ and $R_3$ is selected from the group consisting of alkyl groups of one to three carbon atoms, and an aryl group, and $R_4$ is selected from an aryl group of two to three carbon atoms, and an aryl group, these oxido-oxazoles being present in the form of the free bases or in the form of their hydrochlorides.

* * * * *